United States Patent
Sheperek et al.

(10) Patent No.: US 10,566,063 B2
(45) Date of Patent: Feb. 18, 2020

(54) MEMORY SYSTEM WITH DYNAMIC CALIBRATION USING A TRIM MANAGEMENT MECHANISM

(71) Applicant: Micron Technology, Inc., Boise, ID (US)

(72) Inventors: Michael Sheperek, Longmont, CO (US); Larry J. Koudele, Erie, CO (US); Steve Kientz, Westminster, CO (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/981,810

(22) Filed: May 16, 2018

(65) Prior Publication Data

US 2019/0355426 A1 Nov. 21, 2019

(51) Int. Cl.
*G11C 16/26* (2006.01)
*G06F 3/06* (2006.01)
*G11C 11/56* (2006.01)
*G11C 16/04* (2006.01)

(52) U.S. Cl.
CPC ............ *G11C 16/26* (2013.01); *G06F 3/0604* (2013.01); *G06F 3/0659* (2013.01); *G06F 3/0679* (2013.01); *G11C 11/5628* (2013.01); *G11C 11/5642* (2013.01); *G11C 11/5671* (2013.01); *G11C 16/0483* (2013.01)

(58) Field of Classification Search
CPC . G11C 16/26; G11C 16/0483; G11C 11/5671; G11C 11/5642; G11C 11/5628; G06F 3/0679; G06F 3/0659; G06F 3/0604
See application file for complete search history.

(56) References Cited

U.S. PATENT DOCUMENTS

| | | | |
|---|---|---|---|
| 9,472,298 B1* | 10/2016 | Louie | G11C 16/28 |
| 9,558,850 B1 | 1/2017 | Bialas et al. | |
| 2005/0201148 A1 | 9/2005 | Chen et al. | |
| 2009/0055680 A1 | 2/2009 | Honda et al. | |
| 2010/0073069 A1 | 3/2010 | Wang et al. | |
| 2010/0097857 A1 | 4/2010 | Cernea | |
| 2010/0188919 A1 | 7/2010 | Fox et al. | |
| 2011/0305090 A1 | 12/2011 | Roohparvar et al. | |
| 2012/0236641 A1* | 9/2012 | Hu | G11C 11/5642 365/185.03 |

(Continued)

OTHER PUBLICATIONS

International Application No. PCT/US2018/033877—International Search Report & Written Opinion, dated Sep. 14, 2018, 22 pages.

(Continued)

*Primary Examiner* — Hiep T Nguyen
(74) *Attorney, Agent, or Firm* — Perkins Coie LLP

(57) ABSTRACT

A system comprises a memory device comprising a plurality of memory cells; and a processing device coupled to the memory device, the processing device configured to iteratively: determine a set of read results based on reading a subset of memory cells according to read levels maintained within optimization trim data, wherein the optimization trim data initially comprises at least one read level in addition to a target trim; calibrate the set of read levels based on the set of read results; and remove the calibrated read levels from the optimization trim data when the calibrated read levels satisfy a calibration condition.

20 Claims, 4 Drawing Sheets

(56) References Cited

U.S. PATENT DOCUMENTS

| | | |
|---|---|---|
| 2012/0236653 A1 | 9/2012 | Spessot et al. |
| 2012/0254699 A1 | 10/2012 | Ruby et al. |
| 2013/0007543 A1 | 1/2013 | Goss et al. |
| 2013/0024743 A1 | 1/2013 | Sharon et al. |
| 2013/0117635 A1* | 5/2013 | Ok ............... G11C 29/021 714/773 |
| 2013/0132652 A1 | 5/2013 | Wood et al. |
| 2013/0227200 A1 | 8/2013 | Cometti et al. |
| 2014/0136928 A1 | 5/2014 | Mu et al. |
| 2014/0281661 A1 | 9/2014 | Milton et al. |
| 2014/0281767 A1 | 9/2014 | Alhussien et al. |
| 2015/0085573 A1 | 3/2015 | Sharon et al. |
| 2015/0309858 A1 | 10/2015 | Weilemann et al. |
| 2016/0099049 A1* | 4/2016 | Lee ............... G11C 11/5607 365/148 |
| 2016/0099078 A1* | 4/2016 | Luo ............... G11C 29/46 365/51 |
| 2016/0117216 A1 | 4/2016 | Muchherla et al. |
| 2016/0133334 A1 | 5/2016 | Zhang et al. |
| 2016/0148701 A1 | 5/2016 | Karakulak et al. |
| 2016/0148702 A1* | 5/2016 | Karakulak ......... G11C 16/26 365/185.12 |
| 2016/0259693 A1 | 9/2016 | Sundararaman et al. |
| 2017/0053714 A1 | 2/2017 | Guy et al. |
| 2017/0263311 A1 | 9/2017 | Cometti |
| 2017/0269991 A1 | 9/2017 | Bazarsky et al. |
| 2018/0374550 A1* | 12/2018 | Barndt ............... G11C 16/3427 |
| 2019/0066802 A1* | 2/2019 | Malshe ............... G11C 16/26 |

OTHER PUBLICATIONS

International Application No. PCT/US2018/033881—International Search Report & Written Opinion, dated Sep. 14, 2018, 12 pages.

International Application No. PCT/US2018/033873—International Search Report & Written Opinion, dated Sep. 7, 2018, 9 pages.

TW Patent Application No. 107117756—Taiwanese Office Action and Search Report, dated Jan. 31, 2019, 19 pages.

TW Patent Application No. 107117813—Taiwanese Office Action and Search Report, dated Mar. 18, 2019, 17 pages.

U.S. Appl. No. 15/605,853—Unpublished Patent Application by Bruce A. Liikanen et al., titled "Memory Device With Dynamic Programming Calibration", filed May 25, 2017, 70 pages.

U.S. Appl. No. 15/605,855—Unpublished Patent Application by Larry J. Koudele et al., titled "Memory Device With Dynamic Target Calibration", filed May 25, 2017, 71 pages.

U.S. Appl. No. 15/605,858—Unpublished Patent Application by Larry J. Koudele et al., titled "Memory Device With Dynamic Processing Level Calibration", filed May 25, 2017, 71 pages.

U.S. Appl. No. 15/981,796—Unpublished Patent Application by Michael Sheperek et al., titled "Memory System With Dynamic Calibration Using a Variable Adjustment Mechanism", filed May 16, 2018, 39 pages.

TW Patent Application No. 107117756—Taiwanese Search Report, dated Jul. 22, 2019, with English Translation, 2 pages.

\* cited by examiner

MEMORY SYSTEM WITH DYNAMIC CALIBRATION USING A TRIM MANAGEMENT MECHANISM

RELATED APPLICATION(S)

This application contains subject matter related to a previously-filed U.S. Patent Application by Larry J. Koudele and Bruce A. Liikanen titled "MEMORY DEVICE WITH DYNAMIC PROCESSING LEVEL CALIBRATION." The related application is assigned to Micron Technology, Inc., and is identified by application Ser. No. 15/605,858, which was filed on May 25, 2017. The subject matter thereof is incorporated herein by reference thereto.

This application contains subject matter related to a previously-filed U.S. Patent Application by Larry J. Koudele and Bruce A. Liikanen titled "MEMORY DEVICE WITH DYNAMIC TARGET CALIBRATION." The related application is assigned to Micron Technology, Inc., and is identified by application Ser. No. 15/605,855, which was filed on May 25, 2017. The subject matter thereof is incorporated herein by reference thereto.

This application contains subject matter related to a previously-filed U.S. Patent Application by Bruce A. Liikanen and Larry J. Koudele titled "MEMORY DEVICE WITH PROGRAMMING CALIBRATION." The related application is assigned to Micron Technology, Inc., and is identified by application Ser. No. 15/605,853, which was filed on May 25, 2017. The subject matter thereof is incorporated herein by reference thereto.

This application contains subject matter related to a concurrently-filed U.S. Patent Application by Michael Sheperek, Larry J. Koudele and Steve Kientz titled "MEMORY SYSTEM WITH DYNAMIC CALIBRATION USING A VARIABLE ADJUSTMENT MECHANISM." The related application is assigned to Micron Technology, Inc., and is identified by Ser. No. 15/981,796. The subject matter thereof is incorporated herein by reference thereto.

TECHNICAL FIELD

Embodiments of the disclosure relate generally to memory systems, and, in particular, to memory systems with dynamic calibration using a trim management mechanism.

BACKGROUND

A memory system can be a storage system, such as a solid-state drive (SSD), and can include one or more memory components that store data. For example, a memory system can include memory devices such as non-volatile memory devices, volatile memory devices, or a combination of both. In general, a host system can utilize a memory system to store data at the memory devices of the memory system and to retrieve data stored at the memory system.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
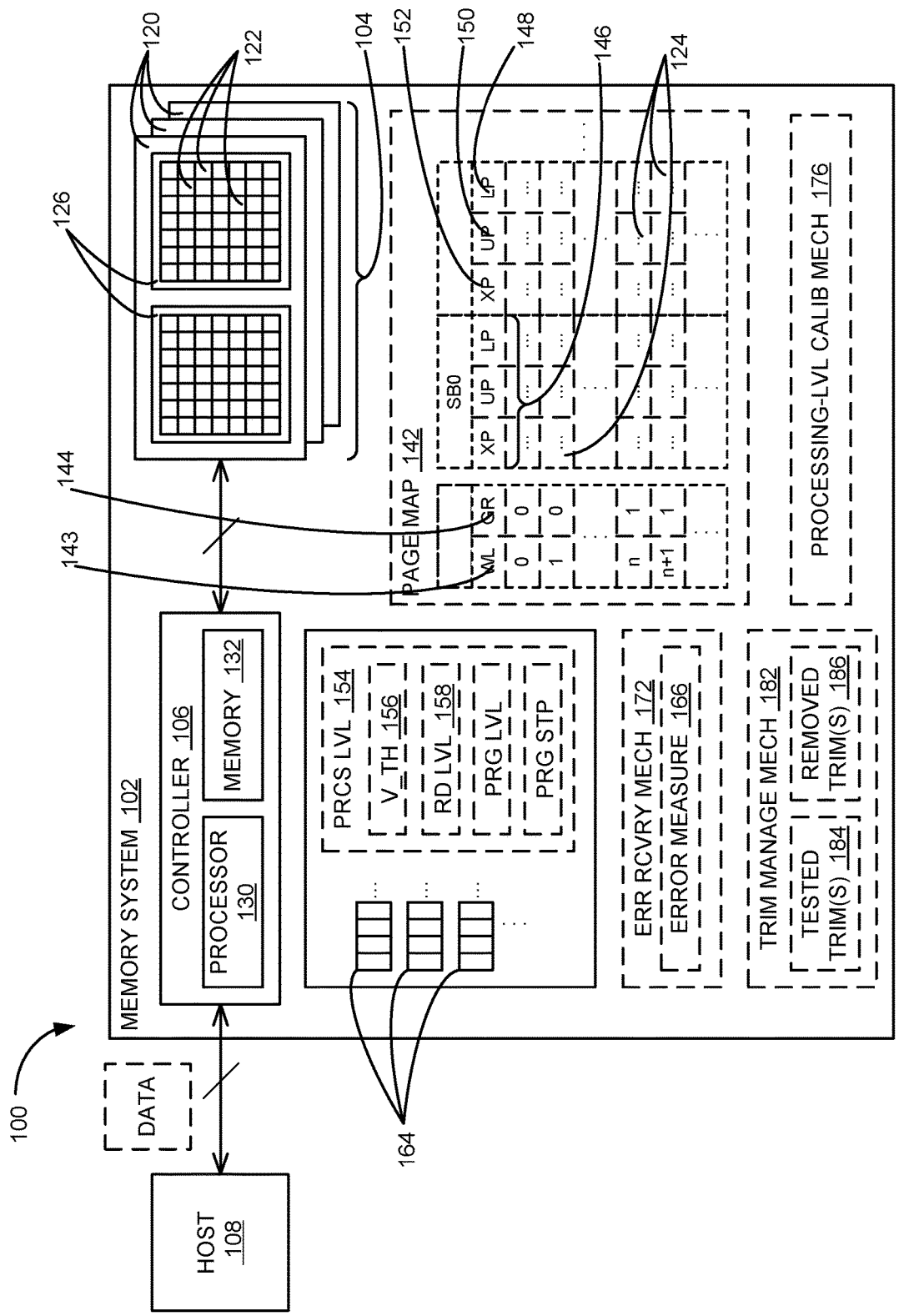
FIG. 1 illustrates an example computing environment that includes a memory system in accordance with some implementations of the present disclosure.

Aspects of the present disclosure are directed to memory systems for dynamically and continuously calibrating processing levels (e.g., read levels). A memory system can be a storage system, such as a solid-state drive (SSD). In some embodiments, the memory system is a hybrid memory/storage system. In general, a host system can utilize a memory system that include media, such as one or more memory devices. The memory devices can include non-volatile memory devices, such as, for example, negative-and (NAND). The host system can provide write requests to store data at the memory devices of the memory system and can provide read requests to retrieve data stored at the memory system.

In storing (e.g., writing) and accessing (e.g., reading) the information, the memory system can use processing levels to perform the operation. For example, the memory system can use read level voltages (e.g., read trims) to determine an amount of charge and the corresponding bit value stored at a read location. However, due to variations in the storage circuit (e.g., the NAND memory cells), the processing levels can differ across the memory devices. Also, the processing levels can change as the capacity (e.g., charge-holding capability) of each memory device degrades over time and use, such as due to wear (e.g., break-down in oxide layers of the storage circuit).

Traditionally, the processing levels are tested and calibrated during the manufacturing process to account for the circuit variations. For example, a first group of read trims (e.g., read level voltage) can be adjusted (e.g., using a predetermined increment) and tested repeated until all of the trims in the group satisfy a test condition. As such, all of the trims in the group are unnecessarily tested until the slowest converging device/group satisfies the test condition.

Aspects of the present disclosure address the above and other deficiencies by dynamically managing an optimization trim list during the processing level calibration process. For example, in implementing the continuous read level calibration, the memory system can gather multiple samples/results (e.g., read results) for each page (e.g., lower page (LP), upper page (UP), extra page (XP), top page (TP), etc.) using different processing levels (e.g., read levels). Using the gathered samples, the memory system can calculate a feedback measure, such as an error count/rate, a representation of a read-window budget (RWB) or a distribution valley, etc., that corresponds to each of the processing levels for a page type. Accordingly, the memory system can compare the error measures and adjust the processing level to lower the resulting error measure.

In adjusting the processing level, the memory system can sample according to a set of read levels that correspond to page types. As a particular trim level converges on a targeted state (e.g., a representation or an estimation of a lowest error measure for the corresponding memory cell), the memory system can remove the read level from the set. In some embodiments, the memory system can optimize a subset of trims for a particular page type. For example, the memory system can iteratively calibrate individual read levels for the particular page type, and then calibrate the subset together.

Based on the removal, the memory system can reduce the number of reads necessary in calibrating the remaining trims. The memory system can eliminate subsequent reads/tests for the removed/calibrated trim and sample only the non-converged trims until they are calibrated. As such, the dynamic management of calibration trims can provide reduced test time in manufacturing, faster re-optimization during deployment, improved resource (e.g., power) efficiency, etc.

FIG. 1 is a block diagram of a computing environment 100 with dynamic processing level calibration mechanism configured in accordance with an embodiment of the present technology. The computing environment 100 includes a memory system 102. As shown, the memory system 102 includes one or more memory devices 104 (e.g., NAND flash) and a controller 106. The memory system 102 can operably couple the memory devices 104 to a host device 108 (e.g., an upstream central processor (CPU)). The memory devices 104 can include circuitry configured to store data and provide access to the stored data. The memory devices 104 can be provided as semiconductor, integrated circuits and/or external removable devices in computers or other electronic devices. The memory devices 104 includes one or more memory regions, or memory units 120. The memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory system 102 and/or the individual memory units 120 can also include other circuit components (not shown), such as multiplexers, decoders, buffers, read/write drivers, address registers, data out/data in registers, etc., for accessing and/or programming (e.g., writing) the data and other functionality, such as for processing information and/or communicating with the controller 106.

Each of the memory units 120 includes an array of memory cells 122 that each store data in several ways. The memory cells 122 can include, for example, floating gate, charge trap, phase change, ferroelectric, magnetoresitive, and/or other suitable storage elements configured to store data persistently or semi-persistently. The memory cells 122 can be one-transistor memory cells that can be can be programmed to a target state to represent information. For instance, electric charge can be placed on, or removed from, the charge storage structure (e.g., the charge trap or the floating gate) of the memory cell 122 to program the cell to a particular data state. The stored charge on the charge storage structure of the memory cell 122 can indicate a threshold voltage (Vt) of the cell. For example, a single level cell (SLC) can be programmed to a targeted one of two different data states corresponding to different threshold voltages which can represent the binary units 1 or 0.

Some memory cells (e.g., flash memory cells) can be programmed to a targeted one of more than two data states. For example, a memory cell that can be programmed to any one of four states (e.g., represented by the binary 00, 01, 10, 11) can be used to store two bits of data, and may be referred to as a multilevel cell (MLC). Still other memory cells can be programmed to any one of eight data states (e.g., 000, 001, 010, 011, 100, 101, 110, 111), permitting the storage of three bits of data in a single cell. Such cells may be referred to as triple level cells (TLC). Even higher number of data states are possible, such as those found in quad level cells (QLC), which can be programmed to any one of 16 data states (e.g., 0000, 0001, 0010, 0011, 0100, 0101, 0110, 0111, 1000, 1001, 1010, 1011, 1100, 1101, 1110, 1111) for storing four bits of data. The memory cells 122 capable of storing higher numbers of data states can provide higher density memories without increasing the number of memory cells, since each cell can represent more than one bit.

The memory cells 122 can be arranged in rows (e.g., each corresponding to a word line 143) and columns (e.g., each corresponding to a bit line). Each word line 143 can include one or more memory pages 124, depending upon the number of data states the memory cells 122 of that word line 143 are configured to store. For example, a single word line of the memory cells 122 that are each configured to store one of two data states (e.g., SLC memory cells configured to store one bit each) can include a single memory page 124. Alternatively, a single word line 143 of the memory cells 122 that are each configured to store one of four data states (e.g., MLC memory cells configured to store two bits each) can include two memory pages 124. Moreover, within the word line 143, pages 124 can be interleaved so that the word line 143 of memory cells 122 that are each configured to store one of two data states (e.g., SLC memory cells) can include two pages, in an "even-odd bit line architecture" (e.g., where all the memory cells 122 in odd-numbered columns of a single word line 143 are grouped as a first page, and all the memory cells 122 in even-numbered columns of the same word line 143 are grouped as a second page). When even-odd bit line architecture is utilized in the word line 143 of memory cells 122 that are each configured to store larger numbers of data states (e.g., memory cells configured as MLC, TLC, QLC, etc.), the number of pages per word line 143 can be even higher (e.g., 4, 6, 8, etc.). Each column can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

The memory system 102 can process data using different groupings of the memory cells 122. For example, the memory pages 124 of the memory cells 122 can be grouped into memory blocks 126. In operation, the data can be written or otherwise programmed (e.g., erased) with regards to the various memory regions of the memory system 102, such as by writing to groups of pages 124 and/or memory blocks 126. In NAND-based memory, a write operation often includes programming the memory cells 122 in selected memory pages 124 with specific data values (e.g., a string of data bits having a value of either logic 0 or logic 1). An erase operation is similar to a write operation, except that the erase operation re-programs an entire memory block 126 or multiple memory blocks 126 to the same data state (e.g., logic 1).

In other embodiments, the memory cells 122 can be arranged in different types of groups and/or hierarchies than shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory system 102 can include only one memory unit 120. Alternatively, the memory system 102 can include two, three, four, eight, ten, or more (e.g., 16, 32, 64, or more) memory units 120. While the memory units 120 are shown in FIG. 1 as including two memory blocks 126 each, in other embodiments, each memory unit 120 can include one, three, four eight, or more (e.g., 16, 32, 64, 100, 128, 256 or more memory blocks). In some embodiments, each memory block can include, e.g., 215 memory pages, and each memory page within a block can include, e.g., 212 memory cells 122 (e.g., a "4 k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the computing environment 100, including managing the memory system 102 and handling communications between the memory system 102 and the host device 108. In some embodiments, the embedded memory 132 can include memory registers storing, e.g., memory pointers, fetched data, etc. The embedded memory 132 can also include read-only memory (ROM) for storing micro-code. While the exemplary memory device 102 illustrated in FIG. 1 has been illustrated as including the controller 106, in another embodiment of the present technology, a memory device may not include a controller, and may instead rely upon external control (e.g., provided by an external host, or by a processor or controller separate from the memory system).

In the illustrated example, further organization or details of the memory devices 104 is represented with a page map 142. The page map 142 can represent groupings, addresses, types, or a combination thereof for the memory pages 124 for each of the memory blocks 126. For example, each of the memory blocks 126 can include the memory pages 124 corresponding to a word-line group 144. Also for example, the memory pages 124 can further correspond to a logical page type 146, such as a lower page (LP) 148, an upper page (UP) 150, an extra page (XP) 152, or a top page (TP) (not shown).

The word-line group 144 can include a grouping of the memory pages 124 corresponding to one or more word lines 143 used to implement processing functions, such as read or write for the data. The word-line group 144 can be a grouping of the memory pages 124 for or connected to the word line 143. The word line 143 can correspond to physical layout or architecture of the memory cells 122.

The page type 146, such as for the UP 150, the LP 148, and the XP 152, can represent a grouping of bits in a specific order for the memory pages 124. The types of pages can correspond to a logical layout, architecture, or value for the memory cells 122. For example, the LP 148 can represent a first information bit stored in the memory pages 124 or the memory cells 122 therein. The LP 148 can be for SLC type of cells, MLC type of cells, TLC type of cells, or a combination thereof. Also for example, the UP 150 can correspond to or represent a second information bit stored in the memory pages 124 or the memory cells 122 therein. The UP 150 can be for the TLC or MLC types of the memory cells 122. Also for example, the XP 152 can represent a third information bit, such as for the most significant bit or the least significant bit, stored in the memory pages 124 or the memory cells 122 therein. The XP 152 can be for the TLC type of the memory cells 122.

The memory system 102 can use processing levels 154 for storing or accessing data. The processing levels 154 can include thresholds or operating levels for voltage or current. For example, the processing levels 154 can include a threshold voltage 156, a read level voltage 158, a programming level voltage, a programming step, or a combination thereof. The threshold voltage 156 can be the voltage applied to the control gate at which the circuitry for the memory cells 122 becomes conductive and a current can be measured. The threshold voltage 156 can be affected and controlled by controlling an amount of charge held in a floating gate or charge trap of the memory cells 122. The memory system 102 can store an amount of charge into the memory cells 122 based on the programming level voltage to represent a corresponding data value. The memory system 102 applies the programming level voltage to control gate or word line to charge up the floating gate or the charge trap. The floating gate or the charge trap can be electrically isolated, which can enable the memory cell to store and hold the charge.

The memory system 102 can use the stored charge to represent data. For example, storing charges on the floating gate or the charge trap can be for storing a bit value of 0 for SLC type cells. A bit value of 1 can correspond to the floating gate or the charge trap with no stored charge for the SLC. In other types of cells, such as for MLC, TLC, or QLC, the memory system 102 can store specific amounts of charge on the floating gate or the charge trap to represent different bit values. The MLC type of cell can have four different charge states, TLC can have eight different charge states, and QLC can have 16 different charge states. Each of the charge states can correspond to a unique binary value as discussed above.

The memory system 102 can read or determine data values stored in the memory cells 122 using the read level voltage 158 corresponding to the data value. The memory system 102 can apply the read level voltage 158 to the control gate and measure the current or the voltage across the memory cell to read the data stored in the cell. The charges stored in the floating gate or the charge trap can screen off or offset the amount of charge placed on control gate for reading or accessing the stored data. As such, with the read level voltage 158 applied, the measured the current or the voltage across the memory cell will correspond to the amount of charges stored in the floating gate or the charge trap.

During operation of the memory system 102, the electrical characteristics of the device (i.e. charge retention capabilities) can change due to repeated data writes, erase, and/or reads. The repeated data operations can lead to the breakdown or wearing of the dielectric structure electrically isolating the floating gate or the charge trap (e.g. the oxide layers). To account for the changing electrical characteristics of the memory cells 122, the memory system 102 can be configured to shift or calibrate the read level voltage 158.

The programming level voltage is associated with the read level voltage 158 and the threshold voltage 156. The programming level voltage, the read level voltage 158, the threshold voltage 156 or a combination thereof can correspond to the number of bits stored in the memory cells 122. For example, memory cells 122 configured to store charge in one of two possible states (e.g., SLC memory cells) may have associated programming levels, read levels and threshold voltages that are different from those used with of memory cells 122 configured to store charge in one of four possible states (e.g., MLC memory cells) or memory cells 122 configured to store charge in one of eight possible states (e.g., TLC memory cells). For each type of memory cell (e.g., SLC, MLC, TLC, QLC, etc.), a specific value of the programming level voltage, the read level voltage 158, the threshold voltage 156, or a combination thereof can be associated with each of the possible data values. The memory system 102 can iteratively store charge in the memory cells 122 for the write or program operation, such as for incremental step pulse programming (ISPP). The programming step can include an increment or a voltage value for increasing the stored charge in each iteration.

The processing levels 154 can be stored in the memory system 102, the host device 108, or a combination thereof. For example, the memory system 102 can include one or more level registers 164 on the controller 106, the memory devices 104, another memory location of the memory system 102, or a combination thereof for storing the processing levels 154. The level registers 164 can store the threshold voltage 156, the read level voltage 158, the programming level voltage, the programming step, or a combination thereof. The memory system 102, controller 106, and/or the host 108 can access the level registers 164, write or adjust the values in the level registers 164, or a combination thereof. Similarly, the processing levels 154 can be stored in the embedded memory of the controller 106, the memory devices 104, another memory location of the memory system 102, or a combination thereof.

The memory system 102 can dynamically calculate or adjust the processing levels 154 based on feedback information. For example, the memory system 102 can continuously update the read level voltage 158 using a processing-level calibration mechanism 176. The processing-level calibration mechanism 176 can be a process, method, function, circuitry, configuration, or a combination thereof for implementing the above-mentioned calibration.

For illustrative purposes, the processing-level calibration mechanism 176 (e.g., a continuous read-level calibration (cRLC) mechanism) is described below using the read level voltage 158. However, it is understood that the processing-level calibration mechanism 176 can be implemented for the threshold voltage 156 of FIG. 1, the programming level voltage, the programming step, or a combination thereof.

The memory system 102 can include a trim management mechanism 182 (e.g., circuitry, dedicated logic, programmable logic, firmware, etc.) to perform the operations described herein. In some embodiments, the controller 106 includes the trim management mechanism 182. For example, the controller 106 can include a processor 130 (processing device) configured to execute instructions stored in local memory 132 for performing the operations described herein. In some embodiments, the trim management mechanism 182 is part of the host system 108, an application, or an operating system. The trim management mechanism 182 can maintain and update a set of trims that will be calibrated, such as by removing trims from the calibration process once they are calibrated and retaining the uncalibrated trims as the subject/target of the calibration process. In other words, the trim management mechanism 182 includes a set of processes/sequences/instructions for maintaining and adjusting tested trim(s) 184. The trim management mechanism 182 can use the processing-level calibration mechanism 176 to calibrate the tested trim(s) 184 (e.g., one or more read levels 158) for the word-line group 144. When the trim/read level(s) satisfy a condition (e.g., a change in trend/direction of adjustments, such as between increasing and decreasing or vice versa), the trim management mechanism 182 can determine the corresponding read level(s) as removed trim(s) 186 and remove them from the tested trim(s) 184.

The trim management mechanism 182 can dynamically change or reduce the list of read levels that are tested/calibrated. As a result, the memory system 102 can reduce the number of reads by eliminating reads for calibrated levels for subsequent/remaining iterations of the processing-level calibration mechanism 176. In some embodiments, for page types (e.g., MLC, TLC, QLC, etc.) with multiple read levels (e.g., three, seven, fifteen, etc.), the memory system 102 can calibrate each of the levels individually, and then calibrate them together as a set. The memory system 102 can remove the set of read levels from the trim list after the set is calibrated together instead of individually removing the read levels based on the individually calibrating them.

In implementing the processing-level calibration mechanism 176, the memory system 102 can execute the trim management mechanism 182. (e.g., circuitry, dedicated logic, programmable logic, firmware, etc.) to perform the operations described herein. In some embodiments, the controller 106 includes a convergence mechanism 182. For example, the controller 106 can include a processor 130 (processing device) configured to execute instructions stored in local memory 132 for performing the operations described herein. In some embodiments, the convergence mechanism 182 is part of the host system 108, an application, or an operating system. The trim management mechanism 182 can use the processing-level calibration mechanism 176 to calibrate a set of the tested trims 184. Accordingly, the memory system 102 can read the targeted memory cells using the tested trims 184, and then calculate error measures based on the read results. The trim management mechanism 182 can adjust the tested trims 184 according to a direction (e.g., increase or decrease) that lowers the error measure. During the iterative adjustment of the tested trims 184, the trim management mechanism 182 can determine when one or more of the trims satisfy a calibration condition (e.g., a dither, such as a change in the adjustment direction across iterations). When one or more of the tested trims 184 satisfy the calibration condition, the trim management mechanism 182 can remove the calibrated trim from the set of the tested trims 184. For subsequent iterations, the memory system 102 can continue calibration of the remaining set of the tested trims 184 without reading with the calibrated trims.

Figure 2A:
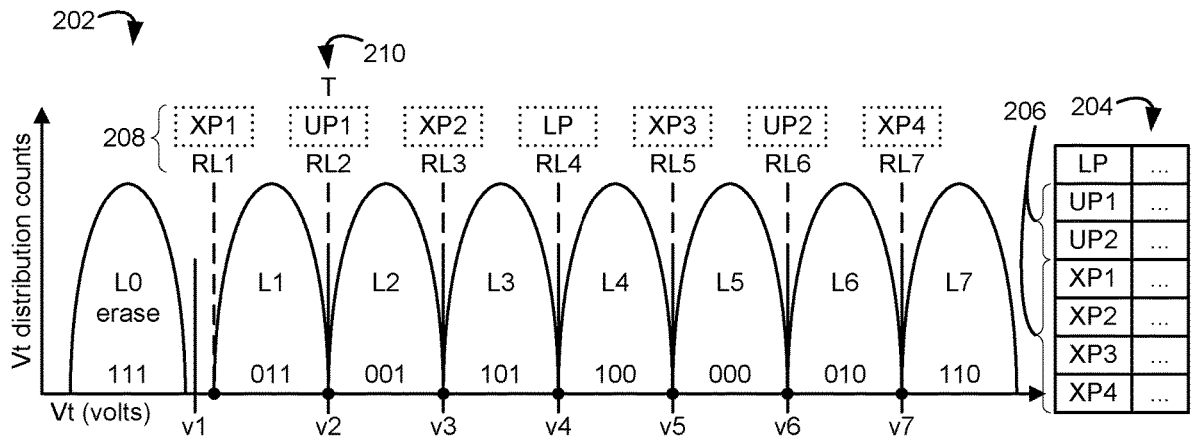
FIGS. 2A, 2B and 2C illustrate different control settings and corresponding read levels in accordance with an embodiment of the present technology.
Figure 2B:
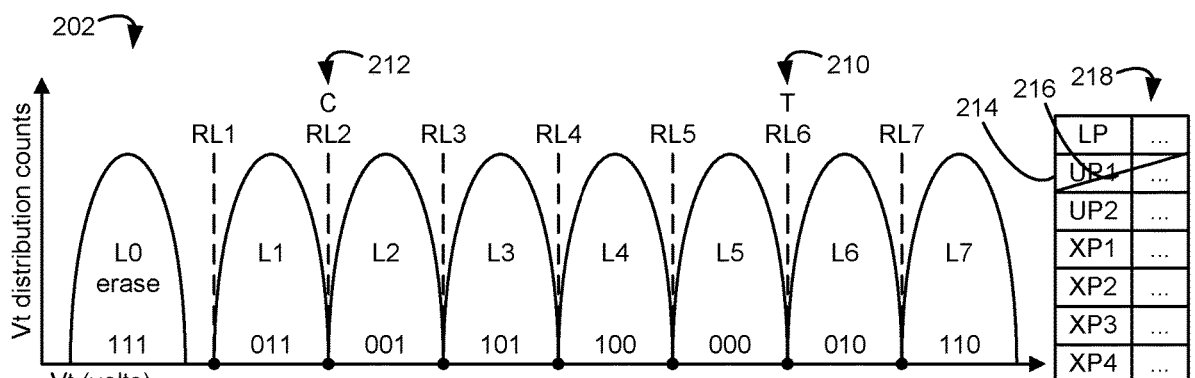
Figure 2C:
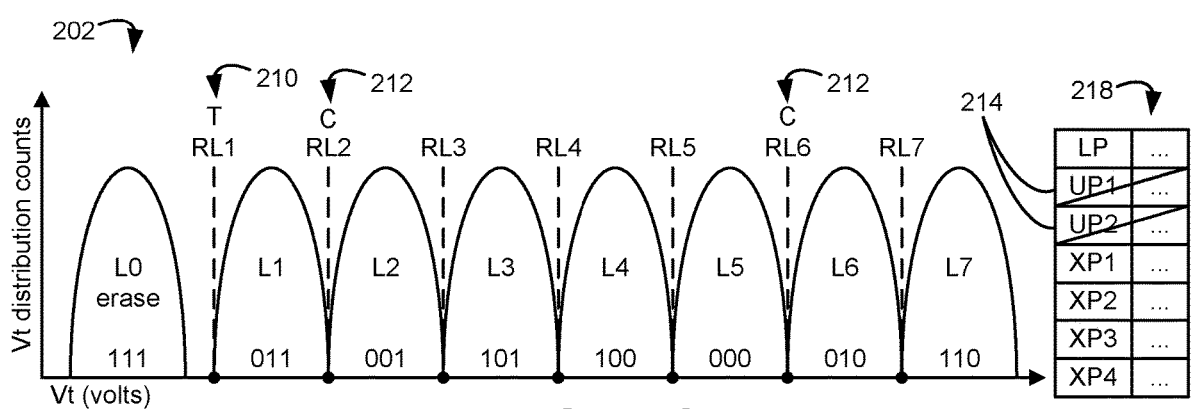

FIGS. 2A, 2B, and 2C illustrate different example control settings and corresponding example read levels in accordance with an embodiment of the present technology. In this regard, FIGS. 2A-2C illustrate a set of iterations implementing the trim management mechanism 182 of FIG. 1 based on determining the removed trim(s) 186 of FIG. 1 and managing the tested trim(s) 184 of FIG. 1. FIGS. 2A-2C each show a trim distribution profile 202 corresponding to the tested trim(s) 184.

The trim distribution profile 202 illustrates a distribution of program-verify (PV) levels according to the current behavior of a grouping of the memory cells, such as for a page (e.g., a TLC page), a logical or stored value, a word-line group, a word line, a die, or a combination thereof. For a TLC page, as illustrate in FIGS. 2A-2C, the trim distribution profile 202 can correspond to the LP 148, the UP 150, and the XP 152, all shown in FIG. 1. The distributions can represent a number of occurrences for a specific trim level (e.g., read level) along a vertical direction or axis. The example illustrations show voltage levels along a horizontal direction or axis. The distributions can correspond to gray codes (e.g., logical values '111,' '011,' '110,' etc.), level groupings (e.g., 'L0,' 'L1,' 'L7,' etc.), a corresponding function/operation, such as an erase operation that sets all bits to '1' and sets the threshold voltage (Vt) below a threshold (e.g., the lowest threshold/read level), or a combination thereof.

The trim distribution profile 202 can include or represent distribution traces that show counts/quantities of different threshold voltages. The distribution traces can form a convex shape for each level (e.g., one of L0-L7) or bit value combination. The trim distribution profile 202 can further include or represent one or more distribution valleys that correspond to an intersection, a separation, an overlap, or a combination thereof between two adjacent distribution targets. The distribution valleys can each be between, at the boundary of, or a combination thereof between two adjacent instances of distribution traces. The distribution valleys can include read level voltages (e.g., different levels of the read level voltage 158).

For TLC pages, such as illustrated in FIGS. 2A-2C, there can be 7 valleys. The distribution valleys are each identified with a valley identification, such as v1-v7 shown in FIG. 2A. Each valley can correspond to a unique division or threshold for the LP 148, the UP 150, and the XP 152, which can be utilized to determine the content stored in the corresponding cells. Each of the distribution valleys can associated with different read level voltages (e.g., RL1-RL7) used to determine the LP 148, the UP 150, the XP 152, the bit value at the corresponding location, or a combination thereof. For TLC pages, there can be 7 different read level voltages, such as RL1-RL7 shown in FIG. 2A-2C. For example, RL1 can correspond to a first XP read level, RL2 can correspond to a first UP read level, RL3 can correspond to a second XP read level, RL4 can correspond to a LP read level, RL5 can correspond to a third XP read level, RL6 can correspond to a second UP read level, and RL7 can correspond to a fourth XP read level.

The trim management mechanism 182 can utilize an optimization trim list 204 to manage the tested trim(s) 184. The optimization trim list 204 can be implemented using the level register 164 of FIG. 1 or other registers/memory components associated with the level register 164. For example, the optimization trim list 204 can be implemented according to software/firmware and stored within the level register 164, the embedded memory 132 of FIG. 1, or a combination thereof.

The optimization trim list 204 can include a list that stores the trim levels (e.g., the tested trim(s) 184) being tested/calibrated for the processing-level calibration mechanism 176 of FIG. 1. Once the trim levels are calibrated (e.g., centered), the trim levels can be determined as the removed trim(s) 186 and deleted from the optimization trim list 204.

In some embodiments, the trim management mechanism 182 can manage the tested trims according to the page type 146 of FIG. 1. For example, the trim management mechanism 182 can manage the tested trim(s) 184 according to page stacks 206. Each of the page stacks 206 can correspond to the read levels (e.g., RL2 for the first UP read level and RL6 for the second UP read level) for the UP 150 of FIG. 1, the read levels (e.g., RL1, RL3, RL5, and RL7 corresponding to the four XP read levels) for the XP 152 of FIG. 1, etc. In some embodiments, the optimization trim list 204 can include the page stacks 206 ordered or sequenced according to a predetermined sequence, such as for a calibration sequence.

The optimization trim list 204 can correspond to a trim set 208, such as for one instance of the word-line group 144 of FIG. 1. In response to read commands, such as from the controller 106 of FIG. 1, the memory cells of the word-line group 144 can be read using the read levels specified in the trim set 208. For example, to calibrate the read levels for the word-line group 144, the trim set 208 can be initially loaded into the optimization trim list 204. As the read levels are calibrated using/during the processing-level calibration mechanism 176, the trim management mechanism 182 can remove the centered read level from the optimization trim list 204.

In some embodiments, as illustrated in FIG. 2A, the memory system 102 can select a specific set of memory cells, such as for an instance of the word-line group 144, in implementing the processing-level calibration mechanism 176. The memory system 102 can load into the optimization trim list 204 the full trim set 208 for the word-line group 144. The memory system 102 can implement the processing-level calibration mechanism 176 and calibrate the tested trim(s) 184 in the optimization trim list 204. In some embodiments, the memory system 102 can select one of the trims, such as a target trim 210, in the optimization trim list 204 as a target of the calibration process.

The memory system 102 can iteratively calibrate the read levels (e.g., one or more of the trims, such as the target trim 210, in the optimization trim list 204) using the processing-level calibration mechanism 176. The memory system 102 (e.g., the controller 106 and/or the memory devices 104 of FIG. 1) can perform multiple reads on the targeted memory cells using a set of test levels that correspond to each of the read levels/valleys. For example, the memory system 102 can read the memory cells using the target trim 210 (e.g., a center read level), a lower read level below the center read level by an offset value, a higher read level above the center read level by the offset value, etc. The memory system 102 can calculate error measures based on the set of read levels, such as error counts, BERs, differences in the error counts/rates between left and right relative to the center, etc. Based on the error measures, the memory system 102 can adjust (e.g., increase or decrease) the read level/trim in a direction that corresponds to the lower read count. In some embodiments, the memory system 102 can determine/estimate that the tested trim corresponds to the lowest error measure (e.g., centered) when the direction/pattern of the adjustments changes or dithers.

When the trim level (e.g., a centered trim 212) is determined as being centered, the memory system 102 can determine the centered trim level 212 as a removed trim 214 and remove it from the optimization trim list 204. As illustrated in FIG. 2B, the memory system 102 can determine that RL2 is centered, as represented as 'C.' In such case, the centered trim level 212 can be the calibrated trim value or the calibrated read level voltage of RL2. The memory system 102 can further determine the RL2 slot or the read level corresponding to v2 as the removed trim 214. The memory system 102 can generate a trim removal indicator 216 (e.g., a pointer, a status bit, an entry in a separate removed list, etc.) that corresponds to the removed trim 214, such as RL2. Using the trim removal indicator 216, the memory system 102 can identify certain trims in the optimization trim list 204 are centered, and thus, no longer needs to be calibrated. Effectively, using the trim removal indicator 216, the memory system 102 can generate a reduced trim list 218 (e.g., a listing of remaining non-centered read levels) for replacing an initial or a previous instance of the optimization trim list 204.

As illustrated in FIG. 2C, the memory system 102 can remove the page stacks 206 when all of the trim levels for the page type have been centered. In some embodiments, the memory system 102 can remove the trim levels immediately as they are centered. In some embodiments, the memory system 102 can first individually test/calibrate the trims in the page stack. When the trims have been centered through individual calibration process, the memory system 102 can calibrate all of the trims in the page stack as a set. When the set of read levels for the page type is centered, the memory system 102 can determine them as the removed trims. Accordingly, the corresponding trims for the page type can be removed from the optimization trim list 204. For subsequent iterations of the processing-level calibration mechanism 176, the memory system 102 can calibrate the remaining read levels without processing the removed trims.

In some embodiments, the memory system 102 of FIG. 1 can read the targeted memory cells according to the optimization trim list 204 in implementing the processing-level calibration mechanism 176. In some embodiments, the memory system 102 can process the read results for the trim levels in the optimization trim list 204. Accordingly, the optimization trim list 204 can remove the calibrated read levels so that they are no longer read/processed in calibrating the rest of the read levels. Based on removing the calibrated/centered read levels, the trim management mechanism 182 can reduce the computing resources necessary to implement the processing-level calibration mechanism 176.

Figure 3:
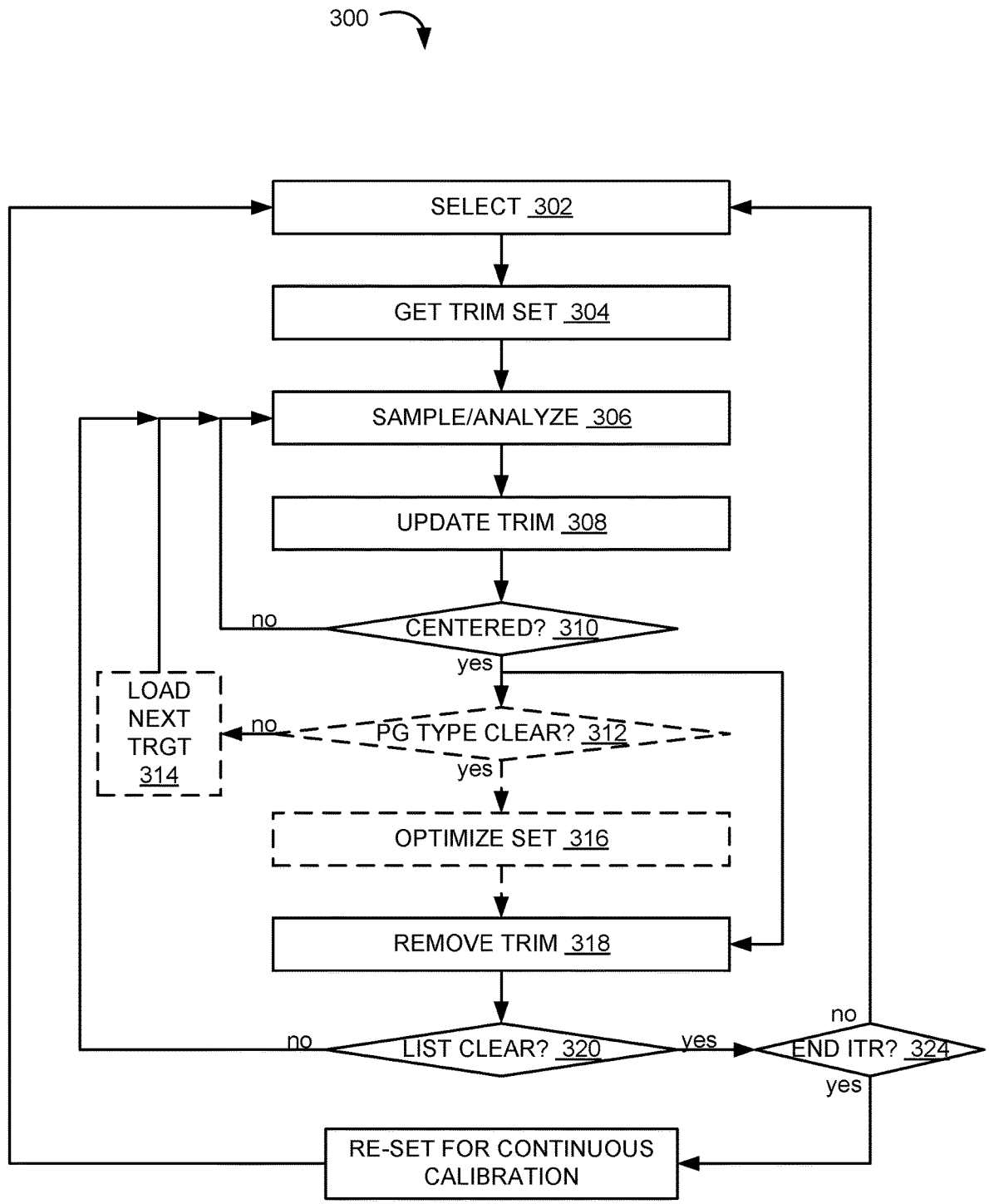
FIG. 3 is a flow diagram of an example method for operating the memory system of FIG. 1, in accordance with an embodiment of the present technology.

FIG. 3 is a flow diagram illustrating an example method 300 of operating the memory system 100 in FIG. 1 in accordance with an embodiment of the present technology. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the trim management mechanism 182 of FIG. 1. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 302, the processing device selects a grouping of the memory cells 122 of FIG. 1 as a target of the calibration process. For example, the processing device can select one of the memory pages 124 of FIG. 1, the word-line group 144 of FIG. 1, etc. that is fully-programmed The selected page can correspond to one or more page types based on the type of selected cells, such as for SLC, MLC, and TLC. The selected page can further correspond to one of the word-line groups 144 and the word line 143, both of FIG. 1. The page selection can be made randomly, iteratively, or a combination thereof. In some embodiments, the processing device can select the page randomly, such as according to a set of instructions/processes for making random selections. In some embodiments, the processing device can select the page according to a predetermined order. The processing device can also select the page based on iteratively selecting through the available/fully-programmed pages.

At block 304, the processing device gets the trim set. The processing device can get the trim set of the targeted memory cells, such that the trim set can be calibrated using the subsequent steps. In some embodiments, the processing device can access the level register 164 of FIG. 1, the optimization trim list 204, or a combination thereof that corresponds to the selected memory cells 122 to get the trim set. In some embodiments, the processing device can access the level register 164 to get the trim set 208 of FIG. 2 that corresponds to the targeted memory pages, and then load the trim set 208 into the optimization trim list 204.

At block 306, the processing device samples (e.g., read) the data using the selected set of processing values/levels. For example, the processing device can select the target trim 210 of FIG. 2 from within the trim set 208 or the optimization trim list 204, and calculate a first offset level (e.g., offset from the target trim 210 along a direction), a second offset level (e.g., offset from the target trim 210 along an opposite direction), etc. based on the target trim 210 and/or a predetermined offset measure. The processing device and/or the memory array 104 can read the selected grouping of the memory cells 122 using the set of read level voltages (e.g., the target trim 210 or the center level, the first offset level, the second offset level, etc.). In some embodiments, the processing device can issue multiple commands for reading the selected memory cells, such as a command for reading with the target trim 210, a command for reading with the first offset level, and a command for reading the second offset level. In some embodiments, the processing device can issue one command that initiates a process (e.g., a read-offset mechanism) in the memory devices 104 that performs the multiple reads using the set of read level voltages.

According to the multiple commands and/or the preconfigured process of the memory devices 104, the memory devices 104 can generate the read results according to the target trim 210 and the associated offset level(s). For example, the memory devices 104 can generate the center result based on reading with the target trim 210, the first offset result based on reading with the first offset level, the second offset result based on reading with the second offset level, etc. The processing device can determine the set of read results based on receiving the read results from the memory devices 104.

The memory system 102 can further analyze the read results. For example, the memory system 102 (e.g., the controller 106) can analyze the determined results and calculate an update direction. The processing device can calculate the error measure (e.g., the error count or the BER) corresponding to each of the target trim 210, the first offset level, the second offset level, etc. In some embodiments, the processing device can calculate one or more differences in the error measures, such as a difference between error measures (e.g., a representation of RWB) corresponding to the center result and the first offset result, a difference between error measures corresponding to the center result and the second offset result, etc.

The processing device can calculate the update direction based on the analysis results (e.g., the error measures or the differences in the error measures). In some embodiments, the processing device can calculate the update direction as a direction, such as either positive (e.g., for increasing the read level) or negative (e.g., for decreasing the read level), that reduces the error measure. For example, the processing device can calculate the update direction as positive when the error measure for the first offset level is less than the error measure for the center result, than that for the second offset level, or both. Also, the processing device can calculate the update direction as negative when the error measure for the second offset level is less than the error measure for the center result, than that for the first offset level, or both.

The memory system 102 can store the update direction as a previous direction for access across iterations. At the next subsequent iteration, the memory system 102 can access the stored update direction as the previous direction 330.

At block 308, the processing device updates the trim according to the analysis results. For example, the processing device can update the target trim 210 in the update direction and either increase or decrease the read level voltage 158 corresponding to the page type, the word-line group, or a combination thereof of the selected memory cells. In some embodiments, the processing device can adjust the target trim 210 by a predetermined amount (e.g., n clicks). In some embodiments, the processing device can calculate an adjustment magnitude, such as based on the error measures, a trend thereof, etc.

At decision block 310, the processing device determines whether the target trim 210 satisfies a break-loop condition. For example, the processing device can estimate whether the target trim 210 is centered, such as at or near the bottom of the error/read-level plot. In some embodiments, the processing device can estimate that the target trim 210 is centered based on determining a dither status. The processing device can determine the dither status when the current update direction differs from the previous update direction (e.g., the update direction of the preceding iteration), such as between an increase and a decrease or vice versa.

When the processing device does not identify the break-loop condition, the processing device returns to block 306. The processing device can sample with the updated trim levels and analyze the corresponding results. Accordingly, the processing device can iteratively calibrate the target trim until the break-loop condition is satisfied.

When the break-loop condition is identified, the processing device can manage/adjust the optimization trim list 204. In some embodiments, the processing device can calibrate the trims according to the corresponding page types. The processing device can calibrate the trims as a set using the page stack 206 of FIG. 2. In some embodiments, the processing device can individually calibrate all of the trims in the page stack 206, and then calibrate the trims together as a single set.

For example, at decision block 312, the processing device can determine whether the centered trim is last of the trim set for the corresponding page type. In other words, for the page stack 206 that includes the centered target trim, the processing device can determine whether all of the other trims within the page stack 206 have been processed and centered. When the processing device determines that not all of the trims have been individually centered, as illustrated at block 314, the processing device can update the target trim 210 as the next trim within the page stack 206. With the updated target trim 210, the processing device can return to block 306. Accordingly, the processing device can iteratively calibrate the individual trims within the page stack 206 until all of the trims (e.g., a set of read levels for the UP, such as UP1/RL2 and UP2/RL6, or a set of read levels for the XP, etc.) have been processed and centered. In some embodiments, processing device can track the status of the trims in the page stack 206 using a predetermined processing sequence and the trim location within the sequence, a status indicator, etc.

Continuing with the example, when all of the trims have been individually centered, the processing device can process the trims within the page stack 206 as a set. At block 316, the processing device optimizes or calibrates the trims of the page stack 206 together. For example, the processing device can sample (e.g., using a center level, upper offset level, lower offset level, etc.) and analyze the read results for each/all of the trims in the page stack 206. The processing device can aggregate the error measure for the trim set and calculate a direction. The processing device can adjust the trims according to the direction until the trim set is centered.

At block 318, the processing device removes the centered trims from the optimization trim list 204. For example, the processing device can update the optimization trim list 204 by generating the trim removal indicator 216 of FIG. 2 for the centered trim(s). In some embodiments, the controller 106 can generate the trim removal indicator 216 for the page stack 206 and/or remove the page stack 206 from the optimization trim list 204 following the process represented by block 316. In some embodiments, the flow can pass directly from block 310 to block 318 for managing/adjusting the optimization trim list 204. Accordingly, the target trim 210 can be removed individually, regardless of the status of other trims in the same page stack 206, when the target trim 210 dithers during the iterative adjustments as determined at block 310.

At decision block 320, the processing device determines whether all of the trims for all page types have been calibrated. For example, the processing device can determine whether or not the optimization trim list 204 is empty. If all of the trims have not been calibrated and the optimization trim list 204 is not empty, the processing device can load the next trim as the target trim 210 as illustrated in block 322. In some embodiments, the processing device can load the next trim as the first trim of the next page stack. The processing device can load the trim according to a predetermined sequence. After updating the target trim 210, the processing device can return to block 306. Accordingly, the memory system 102 can iteratively calibrate the trims and then remove them from the optimization trim list 204 until the list is empty.

When the optimization trim list 204 is empty, such as illustrated at decision block 324, the memory system 102 (e.g., the controller 106) can determine whether trims for all of the memory cells targeted by the processing-level calibration mechanism 176 have been calibrated. If there are remaining memory cells, such as for a set of word-line groups, a collection of pages, a memory block/die, etc., the processing device can return to block 302. Accordingly, the processing device can iteratively select the next set of memory cells and calibrate the corresponding trims as discussed above until trims have been calibrated for all of the targeted memory cells.

Using the optimization trim list 204 in implementing the processing-level calibration mechanism 176 provides reduction in overall number of reads for the calibration process. The processing device can manage the optimization trim list 204 to include only the uncalibrated trims by removing the trims once they have been centered. The processing device can use the optimization trim list 204 to perform the reads instead of reading according to the trim set 208. Accordingly, the processing device can sample only the non-converged trims until they are centered/calibrated. Thus, the processing device can eliminate any subsequent reads for the trim once it becomes centered/calibrated. The reduction in the number of reads is further highlighted when one or a small number of trims are significantly off center, thus requiring many samples to converge. In converging the outlying trims, all other centered trims will continue to re-sample without the optimization trim list 204. Reading the other centered trims provides no new information. Thus, using the optimization trim list 204 to read only the uncalibrated trims can reduce the number of reads and the associated data acquisition time.

Figure 4:
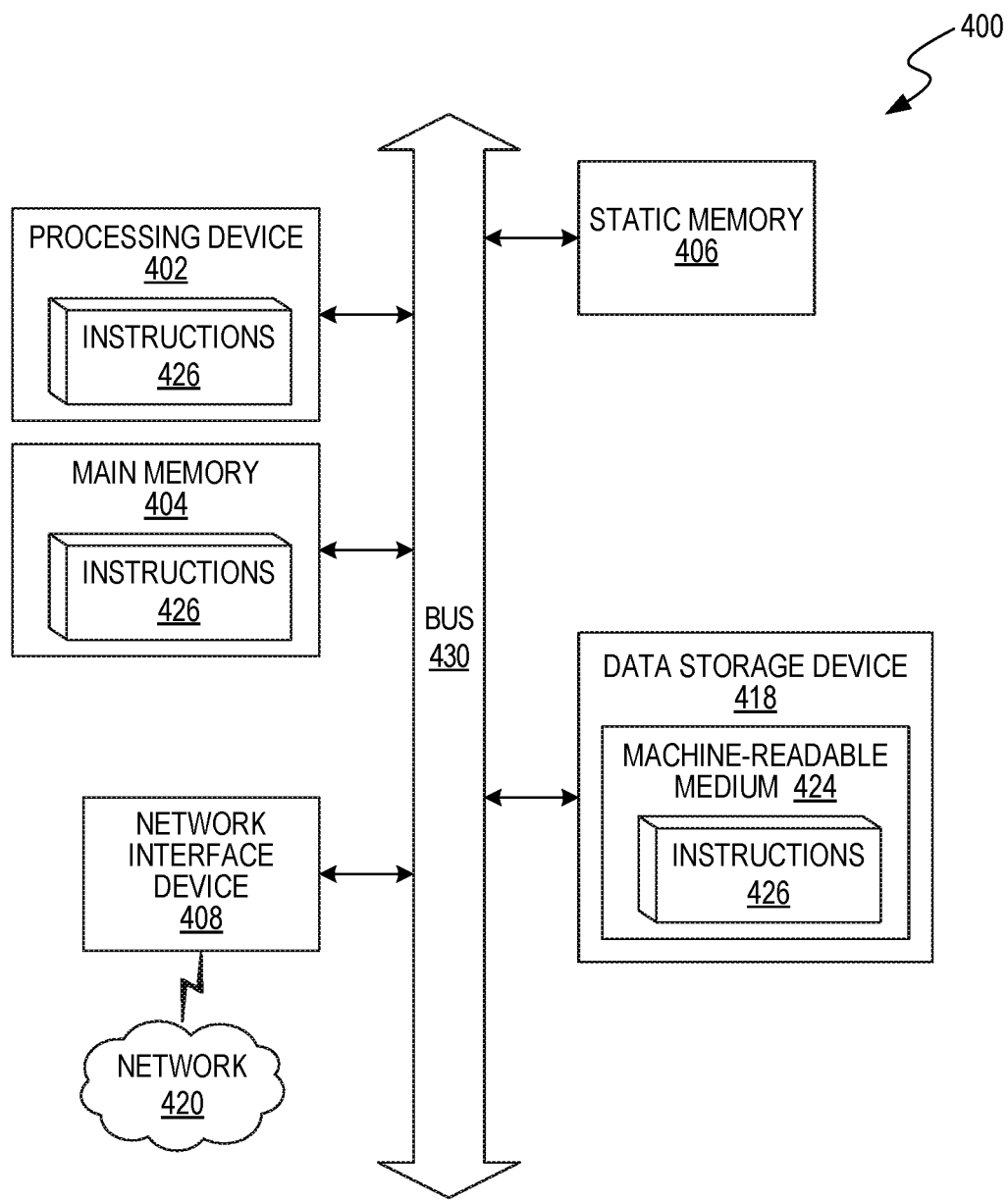
FIG. 4 is a block diagram of an example computer system in which implementations of the present disclosure can operate.

FIG. 4 illustrates an example machine of a computer system 400 within which a set of instructions, for causing the machine to perform any one or more of the methodologies discussed herein, can be executed. In some implementations, the computer system 400 can correspond to a host system (e.g., the host 108 of FIG. 1) that includes or utilizes a memory system (e.g., the memory system 102 of FIG. 1) or can be used to perform the operations of a controller (e.g., to execute an operating system to perform operations corresponding to the trim management mechanism 182 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions or software 426 embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory system 102 of FIG. 1.

In one implementation, the instructions 426 include instructions to implement functionality corresponding to a trim management mechanism (e.g., the trim management mechanism 182 of FIG. 1). While the machine-readable storage medium 424 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

We claim:

1. A system, comprising:
   a memory device comprising a plurality of memory cells; and
   a processing device coupled to the memory device, the processing device configured to iteratively:
      determine a set of read results based on reading a subset of memory cells according to read levels maintained within optimization trim data, wherein:
         the optimization trim data initially comprises at least one read level in addition to a target trim, and
         a trim comprises a read level voltage used to read stored information;
   calibrate the read levels maintained within optimization trim data based on the set of read results; and
   remove the calibrated read levels from the optimization trim data when the calibrated read levels satisfy a calibration condition.

2. The system of claim 1, wherein the processing device is configured to determine a subsequent set of read results after the target trim satisfies the calibration condition, wherein the subsequent set of the read results are determine based on reading according to the read levels without the target trim.

3. The system of claim 1, wherein:
   the optimization trim data comprises the read levels according to page stacks, wherein each of the page stacks comprise a set of read levels for a corresponding page type; and
   the processing device is configured to remove a page stack comprises the target trim when trims within the page stack are calibrated.

4. The system of claim 3, wherein the processing device is configured to:
   individually calibrate the trims within the page stack; and
   calibrate the trims within the page stack as a single set after the trims have been individually calibrated.

5. The system of claim 4, wherein the processing device is configured to calibrate the trims within the page stack as a set by:
   determine a set of read results based on reading the subset of memory cells according to the trims within the page stack;
   calculating an error measure based on aggregating the set of read results;
   determining an adjustment direction based on the error measure; and
   adjusting the trims within the page stack according to the adjustment direction until the calibration condition is satisfied.

6. The system of claim 1, wherein the processing device is configured to calibrate each of the read levels based on:
   selecting the target trim as one of the read levels within the optimization trim data;
   determining a set of read results based on reading the subset of memory cells using the target trim, an upper read level greater than the target trim, and a lower read level less than the target trim;
   calculating a set of error measures corresponding to the set of read results, wherein the set of error measures comprises error measures that correspond to the target trim, the upper read level, and the lower read level;
   calculating a first difference measure and a second difference measure based on the set of error measures, wherein the first difference measure is a difference between the error measures of the upper read level and the target trim and the second difference measure is a difference between the error measures of the lower read level and the target trim;
   determining an update direction corresponding to lower of the first difference measure and the second difference measure, wherein the update direction is for decreasing the target trim when the first difference measure is lower or for increasing the target trim when the second difference measure is lower; and
   adjusting the target trim according to the update direction.

7. The system of claim 6, wherein the processing device is configured to:
   store a previous direction at a previous iteration, wherein the previous direction is the update direction determined at the previous iteration preceding a current iteration;
   determine the update direction for the current iteration; and
   determine that the target trim satisfies the calibration condition when the update direction for the current iteration differs from the previous direction of the previous iteration.

8. The system of claim 1, wherein the processing device is configured to remove the target trim based on generating a trim removal indicator for the target trim when the target trim satisfies the calibration condition.

9. The system of claim 1, wherein the processing device is configured to remove the target trim based on generating a reduced trim data for replacing the optimization trim data, wherein the reduced trim data comprises trims in the optimization trim data without the removed target trim.

10. The system of claim 1, wherein the processing device is configured to remove the target trim when the target trim satisfies the calibration condition and independent of a calibration status of other read levels within the optimization trim data.

11. A method comprising calibrating read levels in a trim set for a subset of memory cells based on iteratively:
  determining a set of read results based on reading a subset of memory cells according to read levels maintained within optimization trim data, wherein:
    the optimization trim data initially comprises at least one read level in addition to a target trim, and
    a trim comprises a read level voltage used to read stored information;
  calibrating the read levels maintained within optimization trim data based on the set of read results; and
  removing the calibrated read levels from the optimization trim data when the calibrated read levels satisfy a calibration condition.

12. The method of claim 11, further comprising, after the target trim satisfies the calibration condition, determining a subsequent set of read results without reading with the target trim.

13. The method of claim 11, wherein:
  the optimization trim data comprises a page stack that includes a set of read levels for a page type, wherein the page stack includes the target trim; and
  removing the target trim comprises removing the page stack when the read levels in the page stack are calibrated.

14. The method of claim 13, wherein calibrating the set of read levels comprises:
  individually calibrating the trims within the page stack; and
  calibrating the trims within the page stack as a single set after the trims have been individually calibrated.

15. The method of claim 14, wherein calibrating the trims within the page stack as a single set comprises iteratively:
  reading the subset of memory cells according to the trims within the page stack;
  calculating an error measure based on aggregating the set of read results;
  determining an adjustment direction based on the error measure; and
  adjusting the trims within the page stack as a single set according to the adjustment direction until the calibration condition is satisfied.

16. The method of claim 11, wherein calibrating the set of read levels comprises:
  selecting the target trim as one of the read levels within the optimization trim data;
  determining a set of read results based on reading the subset of memory cells using the target trim, an upper read level greater than the target trim, and a lower read level less than the target trim;
  calculating a set of error measures corresponding to the set of read results, wherein the set of error measures comprises error measures that correspond to the target trim, the upper read level, and the lower read level;
  calculating a first difference measure and a second difference measure based on the set of error measures, wherein the first difference measure is a difference between the error measures of the upper read level and the target trim and the second difference measure is a difference between the error measures of the lower read level and the target trim;
  determining an update direction corresponding to lower of the first difference measure and the second difference measure, wherein the update direction is for decreasing the target trim when the first difference measure is lower or for increasing the target trim when the second difference measure is lower; and
  adjusting the target trim according to the update direction.

17. The method of claim 16, further comprising:
  storing a previous direction at a previous iteration, wherein the previous direction is the update direction determined at the previous iteration preceding a current iteration;
wherein:
  determining the update direction comprises determining the update direction for the current iteration; and
  removing the target trim comprises removing the target trim when the update direction for the current iteration differs from the previous direction of the previous iteration.

18. The method of claim 11, wherein:
  removing the target trim comprises generating a trim removal indicator for the target trim when the target trim satisfies the calibration condition; and
  determining the set of read results comprises ignoring the read level corresponding to the trim removal indicator.

19. The method of claim 11, wherein:
  removing the target trim comprises generating a reduced trim data for replacing the optimization trim data, wherein the reduced trim data includes trims in the optimization trim data without the removed target trim; and
further comprising:
  determining a set of subsequent results based on reading the subset of memory cells according to the reduced trim data instead of the optimization trim data after the target trim is calibrated.

20. The method of claim 11, wherein removing the target trim comprises removing the target trim independent of a calibration status of other read levels within the optimization trim data.

* * * * *